US012658255B2

(12) United States Patent
Di Vincenzo et al.

(10) Patent No.: US 12,658,255 B2
(45) Date of Patent: Jun. 16, 2026

(54) SENSING CIRCUIT IN A VERTICAL MEMORY SYSTEM

(71) Applicant: Micron Technology, Inc., Boise, ID (US)

(72) Inventors: Umberto Di Vincenzo, Capriate San Gervasio (IT); Ferdinando Bedeschi, Biassono (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 18/788,047

(22) Filed: Jul. 29, 2024

(65) Prior Publication Data

US 2025/0308589 A1 Oct. 2, 2025

Related U.S. Application Data

(60) Provisional application No. 63/573,348, filed on Apr. 2, 2024.

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0069* (2013.01); *G11C 2013/0083* (2013.01); *G11C 2213/71* (2013.01)

(58) Field of Classification Search
CPC .............. G11C 13/004; G11C 13/0004; G11C 13/0069; G11C 2013/0083; G11C 2213/71; G11C 7/14; G11C 2207/002; G11C 7/065; G11C 13/0026; G11C 7/067; G11C 7/12; G11C 5/063; G11C 7/06; H10D 30/6728

USPC ........................................................ 365/163
See application file for complete search history.

(56) References Cited

U.S. PATENT DOCUMENTS

| | | | | |
|---|---|---|---|---|
| 9,595,323 B1 * | 3/2017 | Chen | .................. | G11C 13/0028 |
| 9,786,383 B2 * | 10/2017 | Chen | ..................... | G11C 17/16 |
| 2012/0044733 A1 * | 2/2012 | Scheuerlein | ......... | G11C 17/165 |
| | | | | 257/E21.003 |

(Continued)

FOREIGN PATENT DOCUMENTS

WO 2023/283518 A1 1/2023

OTHER PUBLICATIONS

European Patent Office, "Extended Search Report," issued in connection with European Patent Application No. 25166289.6 dated Jul. 24, 2025 (11 pages).

*Primary Examiner* — Tha-O H Bui
(74) *Attorney, Agent, or Firm* — Holland & Hart LLP

(57) ABSTRACT

Methods, systems, and devices for a sensing circuit in a vertical memory system are described. An apparatus may include a set of memory cells each coupled with a respective pillar of a set of pillars. A set of transistors, each of which is coupled with a digit line common to the set of memory cells, may be coupled with a respective pillar of the set of pillars. A first transistor of the set of transistors may include a first terminal coupled with a first bias line and a first pillar of the set of pillars, and may include a second terminal coupled with the digit line. A second transistor of the set of transistors may include a first terminal coupled with a second bias line and a second pillar of the set of pillars, and may include a gate terminal coupled with the digit line.

24 Claims, 8 Drawing Sheets

(56)     References Cited

U.S. PATENT DOCUMENTS

| 2021/0383864 | A1 | 12/2021 | Jung et al. |
| 2023/0005916 | A1 | 1/2023 | Vimercati |

\* cited by examiner

SECTION A-A

Unselected Memory Cell 105        Selected Memory Cell 105-a

200

SECTION B-B

Unselected Memory Cell 105       Selected Memory Cell 105-a

SECTION C-C

Unselected Memory Cell 105       Selected Memory Cell 105-a

Figure 4B:
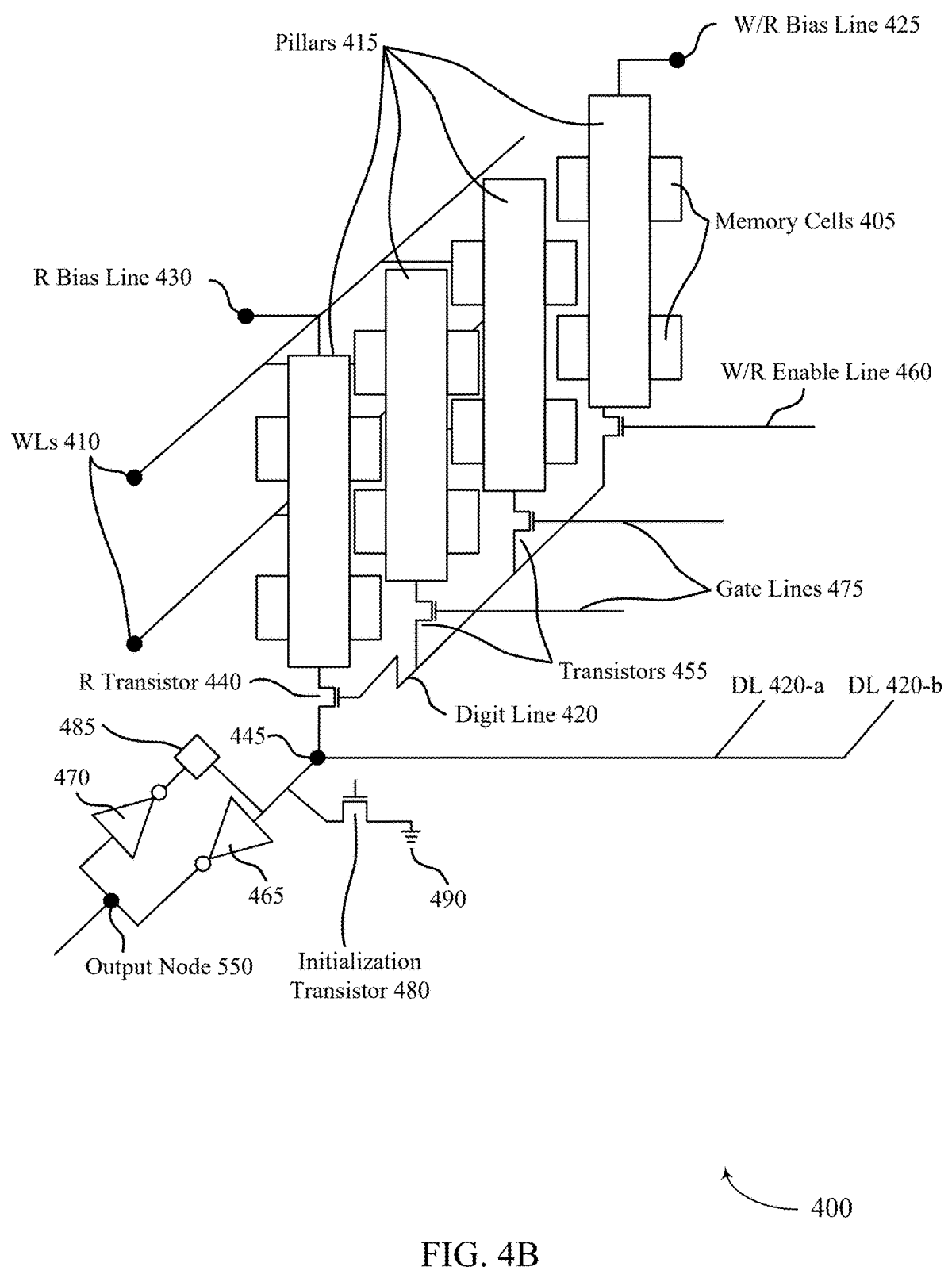

Pillars 415

W/R Bias Line 425

Memory Cells 405

R Bias Line 430

W/R Enable Line 460

WLs 410

Gate Lines 475

Transistors 455

R Transistor 440

DL 420-a     DL 420-b

Digit Line 420

485

470

445

465

490

Output Node 550

Initialization
Transistor 480

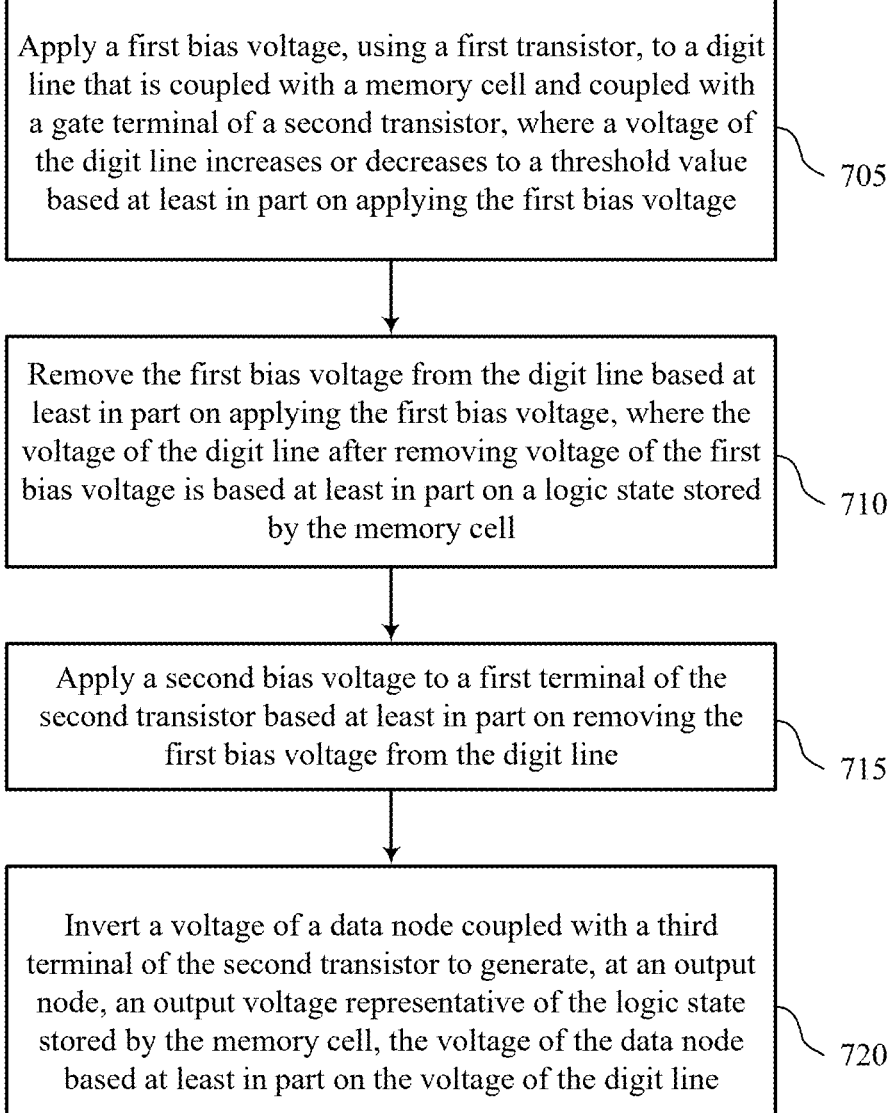

Apply a first bias voltage, using a first transistor, to a digit line that is coupled with a memory cell and coupled with a gate terminal of a second transistor, where a voltage of the digit line increases or decreases to a threshold value based at least in part on applying the first bias voltage

705

Remove the first bias voltage from the digit line based at least in part on applying the first bias voltage, where the voltage of the digit line after removing voltage of the first bias voltage is based at least in part on a logic state stored by the memory cell

710

Apply a second bias voltage to a first terminal of the second transistor based at least in part on removing the first bias voltage from the digit line

715

Invert a voltage of a data node coupled with a third terminal of the second transistor to generate, at an output node, an output voltage representative of the logic state stored by the memory cell, the voltage of the data node based at least in part on the voltage of the digit line

SENSING CIRCUIT IN A VERTICAL MEMORY SYSTEM

CROSS REFERENCE

The present application for patent claims priority to U.S. Patent Application No. 63/573,348 by Vincenzo et al., entitled "SENSING CIRCUIT IN A VERTICAL MEMORY SYSTEM," filed Apr. 2, 2024, which is assigned to the assignee hereof, and which is expressly incorporated by reference in its entirety herein.

TECHNICAL FIELD

The following relates to one or more systems for memory, including a sensing circuit in a vertical memory system.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (for example, sense, detect, retrieve, determine) states from the memory cells. To store information, the memory device may write (for example, program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 4A and 4B show examples of a memory array that supports a sensing circuit in a vertical memory system in accordance with examples as disclosed herein.

FIG. 7 shows a flowchart illustrating a method or methods that support a sensing circuit in a vertical memory system in accordance with examples as disclosed herein.

DETAILED DESCRIPTION

Figure 1:
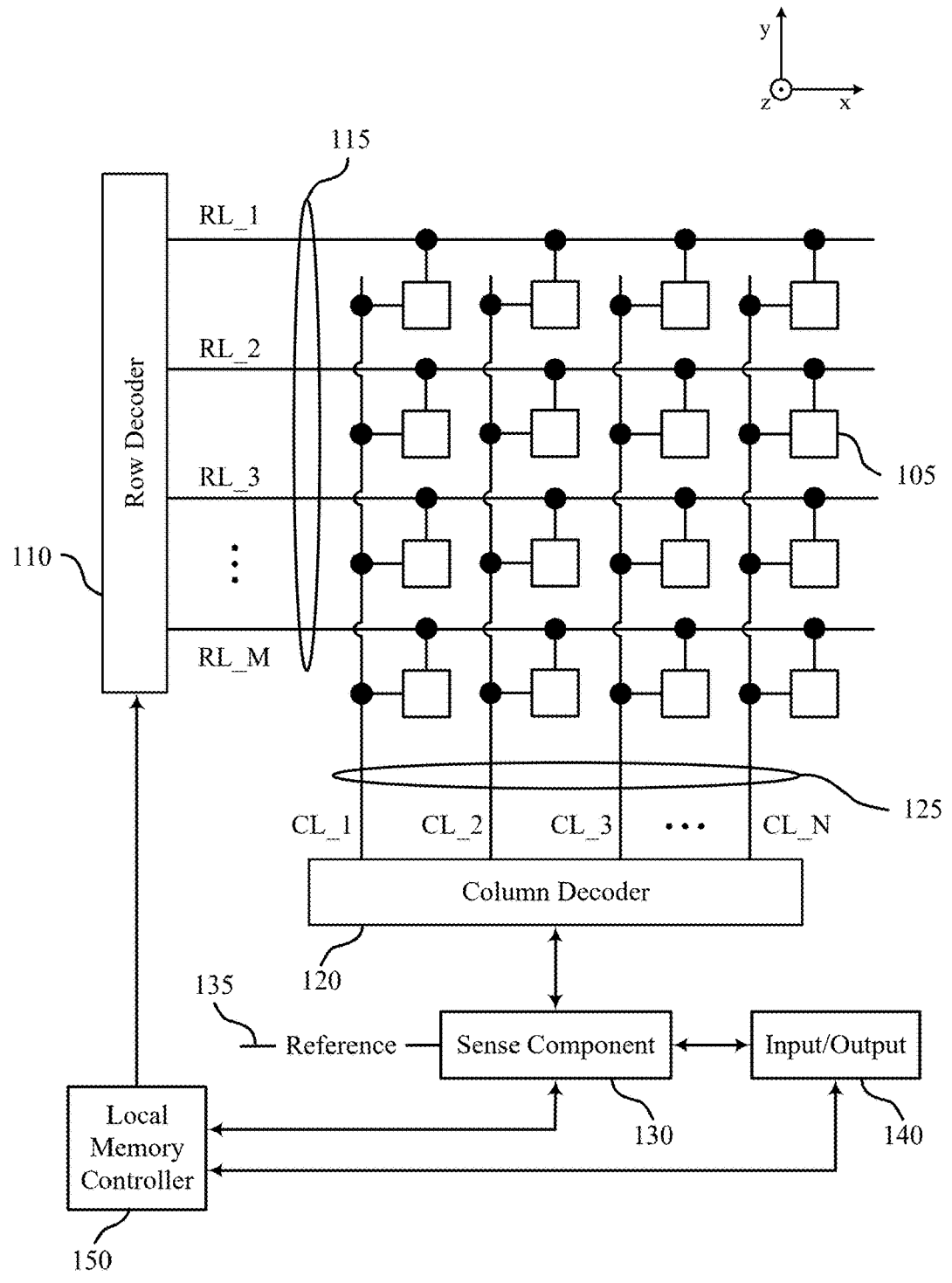
FIG. 1 shows an example of a memory array that supports a sensing circuit in a vertical memory system in accordance with examples as disclosed herein.

A vertical memory system may include, among other components, a vertical memory array that includes tiers of memory cells coupled with pillars that extend through the tiers. To enable parallel sensing of memory cells that are coupled with different digit lines (e.g., at the bottom of the pillars), the vertical memory system may include a sense amplifier for each digit line. But inclusion of a sense amplifier for each digit line may take up valuable space in the vertical memory system, and operating the various sense amplifiers may consume a non-negligible amount of power, among other disadvantages. Designs and techniques for reducing the space and power consumed by sensing circuitry in a vertical memory system may be desired.

According to the designs and techniques described herein, the space and power consumed by sensing circuitry in a vertical memory system may be reduced, relative to other different designs and techniques, by operating (e.g., re-purposing) unused thin film transistors (TFTs) at the edges of an vertical memory array to sense the memory cells coupled with a digit line. In some examples, a first TFT, which may be referred to as a write/read (W/R) bias TFT, may be used to pre-charge the digit line before sensing. In some examples, a second TFT, which may be referred to as read (R) bias TFT, may be used to amplify the signal output by a sensed memory cell. In some examples, the second TFT may be coupled with one or more inverters that invert and latch the amplified signal (for example, for future use).

In addition to applicability in memory systems as described herein, techniques for sensing a vertical memory array may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by reducing power consumption, which may improve user experience, among other benefits.

In addition to applicability in memory systems as described herein, techniques for sensing a vertical memory array may be generally implemented to improve the sustainability of various electronic devices and systems. As the use of electronic devices has become even more widespread, the quantity of energy used and harmful emissions associated with production of electronic devices and device operation has increased. Further, the amount of waste (for example, electronic waste) associated with disposal of electronic devices may also pose environmental concerns. Implementing the techniques described herein may improve the impact related to electronic devices by reducing materials used to produce electronic devices.

Features of the disclosure are illustrated and described in the context of memory devices and arrays. Features of the disclosure are further illustrated and described in the context of a memory array, a timing diagram, a device diagram, and a flowchart.

FIG. 1 shows an example of a memory device 100 that supports a sensing circuit in a vertical memory system in accordance with examples as disclosed herein. In some examples, the memory device 100 may be referred to as or include a memory die, a memory chip, or an electronic memory apparatus. The memory device 100 may be operable to provide locations to store information (for example, physical memory addresses) that may be used by a system (for example, a host device coupled with the memory device 100, for writing information, for reading information).

The memory device 100 may include one or more memory cells 105 that each may be programmable to store different logic states (for example, a programmed one of a set of two or more possible states). For example, a memory cell 105 may be operable to store one bit of information at a time (for example, a logic 0 or a logic 1). In some examples, a memory cell 105 (for example, a multi-level memory cell 105) may be operable to store more than one bit of information at a time (for example, a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (for example, undergo a phase change) during normal operation of the memory cell 105. For example, a phase change memory cell 105 may be associated with a relatively disordered atomic configuration (for example, a relatively amorphous state)

and a relatively ordered atomic configuration (for example, a relatively crystalline state). A relatively disordered atomic configuration may correspond to a first logic state (for example, a RESET state, a logic 0) and a relatively ordered atomic configuration may correspond to a second logic state (for example, a logic state different than the first logic state, a SET state, a logic 1).

In some examples (for example, for thresholding memory cells 105, for self-selecting memory cells 105), some or all of the set of logic states supported by the memory cells 105 may be associated with a relatively disordered atomic configuration of a chalcogenide material (for example, the material in an amorphous state may be operable to store different logic states). In some examples, the storage element of a memory cell 105 may be an example of a self-selecting storage element. In such examples, the material used in the memory cell 105 may be based on an alloy (for example, such as the alloys listed above) and may be operated so as to undergo a change to a different physical state during normal operation of the memory cell 105. For example, a self-selecting or thresholding memory cell 105 may have a high threshold voltage state and a low threshold voltage state, where a corresponding "threshold voltage" may refer to a voltage at which or above which the memory cell 105 transitions from a relatively higher-resistance (for example, non-conductive) state to a relatively lower-resistance (for example, conductive) state, such as in response to an applied voltage. A high threshold voltage state may correspond to a first logic state (for example, a RESET state, a logic 0) and a low threshold voltage state may correspond to a second logic state (for example, a logic state different than the first logic state, a SET state, a logic 1).

During a write operation (for example, a programming operation) of a self-selecting or thresholding memory cell 105, a polarity used for a write operation may influence (for example, determine, set, program) a behavior or characteristic of the material of the memory cell 105, such as a thresholding characteristic (for example, a threshold voltage) of the material. A difference between thresholding characteristics (for example, resistivity characteristics, conductivity characteristics) of the material of the memory cell 105 for different logic states stored by the material of the memory cell 105 (for example, a difference between threshold voltages when the material is storing a logic state '0' versus a logic state '1') may correspond to the read window of the memory cell 105.

The memory device 100 may include access lines (for example, row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (for example, addressed) along an illustrative z-direction, such as in an implementation of sets of memory cells 105 being located at different levels (for example, layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (for example, applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (for example, by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (for example, a material state, a resistance state, a threshold state) of a memory cell 105 and determine a logic state of the memory cell 105 based on the detected state. The sense component 130 may include one or more sense amplifiers to convert (for example, amplify) a signal resulting from accessing the memory cell 105 (for example, a signal of a column line 125 or other access line). The sense component 130 may compare a signal detected from the memory cell 105 to a reference 135 (for example, a reference voltage, a reference charge, a reference current). The detected logic state of the memory cell 105 may be provided as an output of the sense component 130 (for example, to an input/output component 140), and may indicate the detected logic state to another component of the memory device 100 or to a host device coupled with the memory device 100.

The local memory controller 150 may control the accessing of memory cells 105 through the various components (for example, a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (for example, commands, data) from one or more different controllers (for example, an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (for example, voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (for example, from a host device). The local memory controller 150 may be operable to perform other access operations not listed here or other operations related to the operating of the memory device 100 that are not directly related to accessing the memory cells 105.

In some examples, there may be a sense component 130 for each column line 125 (also referred to as a digit line or a sense line). But including a sense component 130 (for example, a sense amplifier) for each digit line may reduce space for other components and may result in excess power consumption, among other disadvantages. According to the designs described herein, TFTs coupled with unused pillars on the digit lines may be used to implement a sensing scheme that allows the sense components 130 to be omitted from the memory device 100. The sensing scheme may be enabled by the application of bias voltages to the TFTs, which may be applied to the TFTs via bias lines. To facilitate the capture of a sensed logic state, the designs may include a configuration of inverters (for example, for a given digit line) that invert and latch a signal representative of the logic state.

The memory device 100 may include any quantity of non-transitory computer readable media that support a sensing circuit in a vertical memory system. For example, a local memory controller 150, a row decoder 110, a column decoder 120, a sense component 130, or an input/output component 140, or any combination thereof may include or may access one or more non-transitory computer readable media storing instructions (for example, firmware) for performing the functions ascribed herein to the memory device 100. For example, such instructions, if executed by the memory device 100, may cause the memory device 100 to perform one or more associated functions as described herein.

Figure 2:
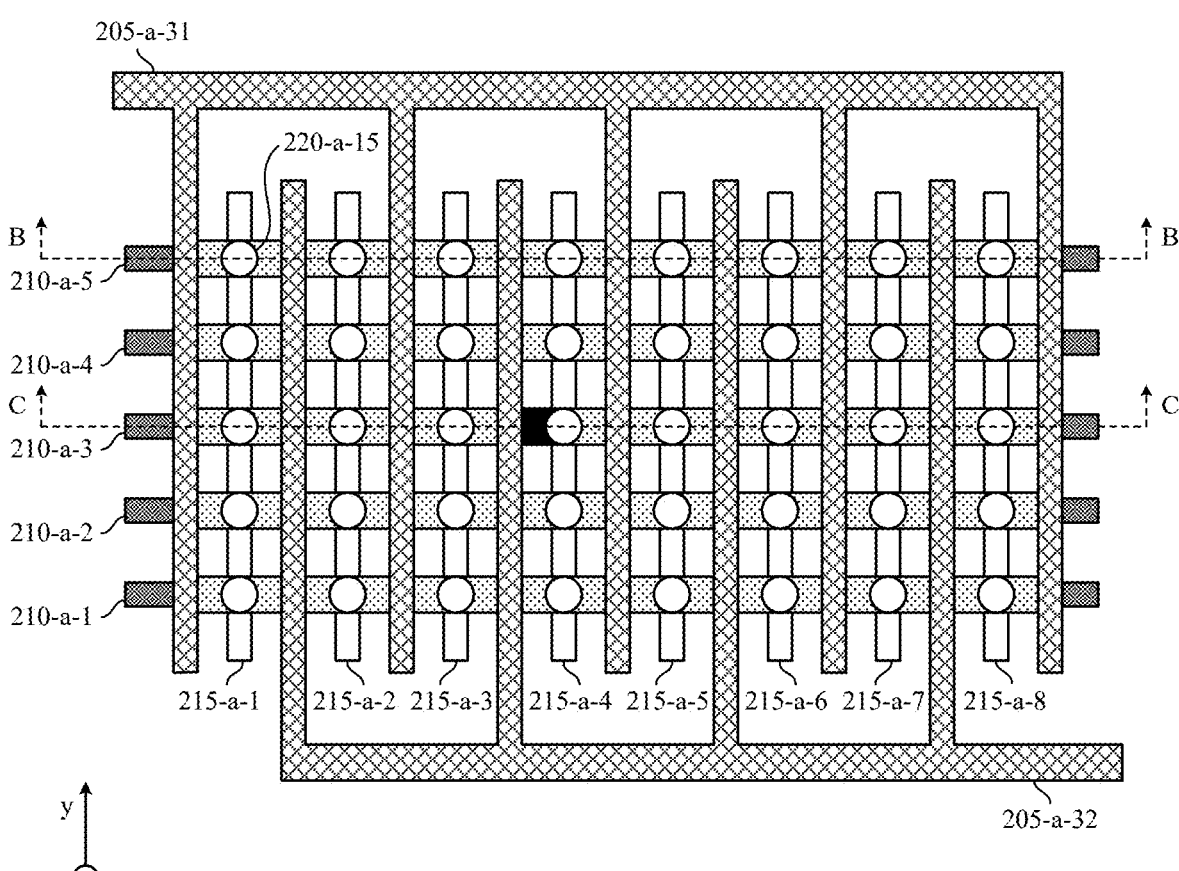
FIG. 2 shows a top view of an example of a memory array that supports a sensing circuit in a vertical memory system in accordance with examples as disclosed herein.
Figure 3A:
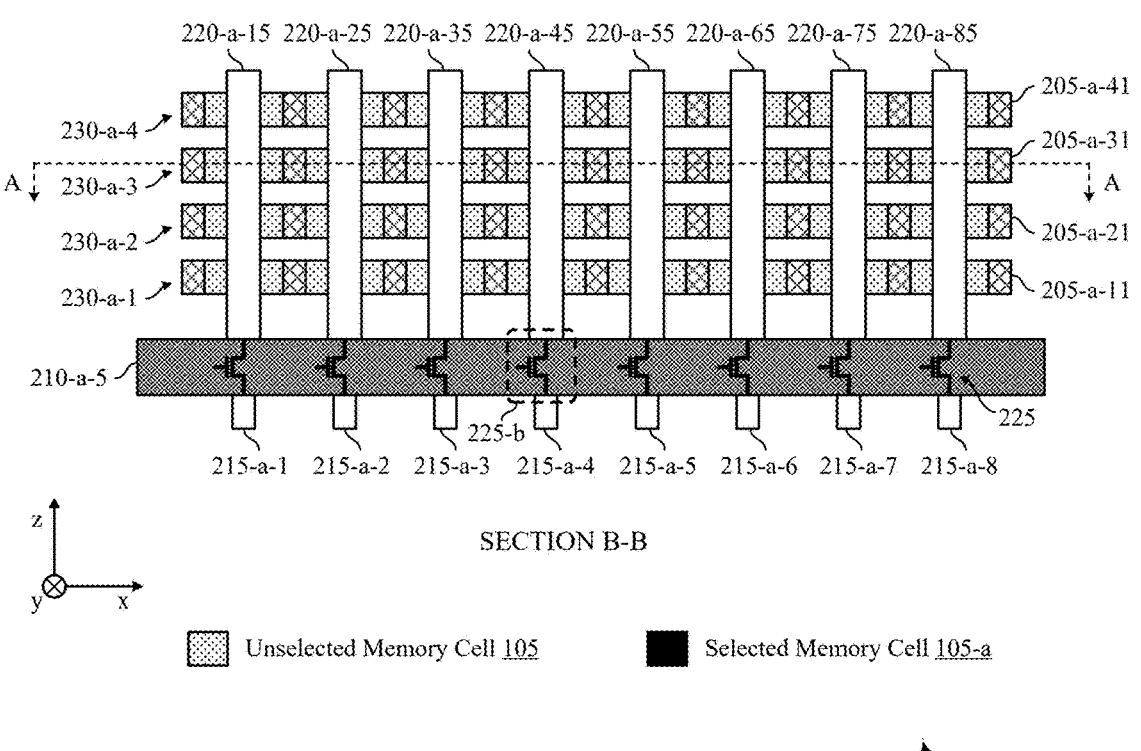
FIGS. 3A and 3B show side views of an example of a memory array that supports a sensing circuit in a vertical memory system in accordance with examples as disclosed herein.
Figure 3B:
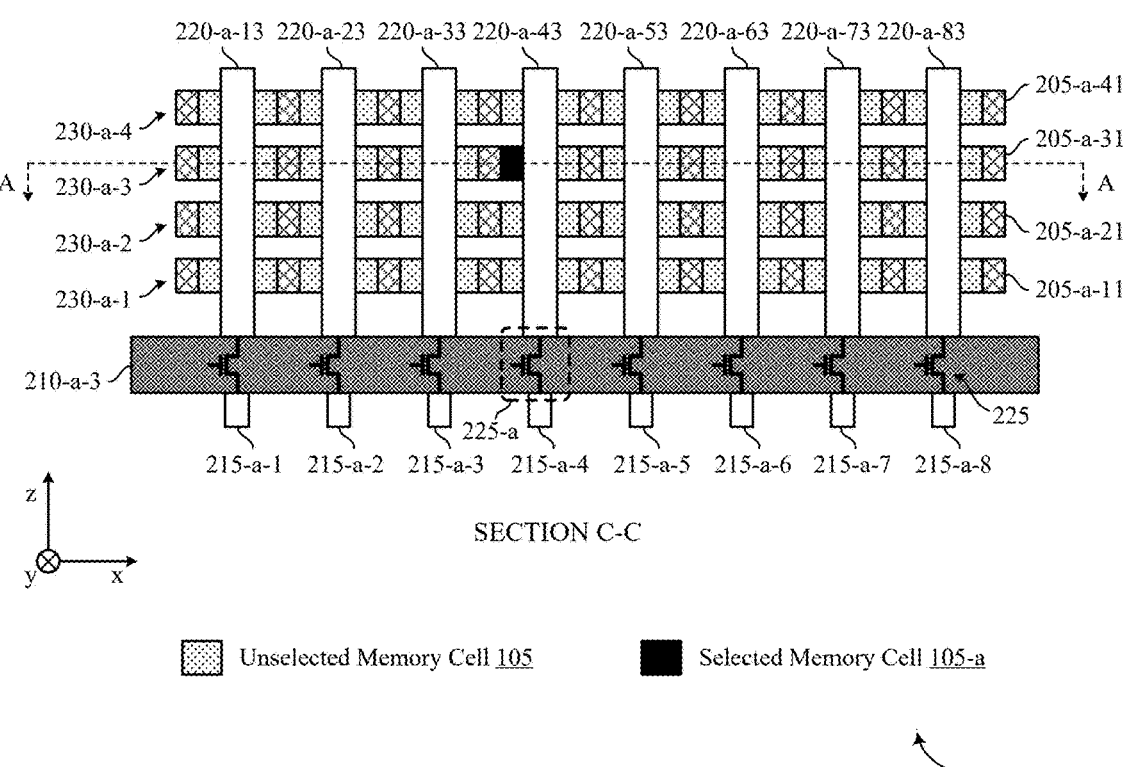

FIGS. 2, 3A, and 3B show an example of a memory array 200 that supports a sensing circuit in a vertical memory system in accordance with examples as disclosed herein. The memory array 200 may be included in a memory device 100, and illustrates an example of a three-dimensional arrangement of memory cells 105 that may be accessed by various conductive structures (for example, access lines). FIG. 2 illustrates a top section view (for example, SECTION A-A) of the memory array 200 relative to a cut plane A-A as shown in FIGS. 3A and 3B. FIG. 3A illustrates a side section view (for example, SECTION B-B) of the memory array 200 relative to a cut plane B-B as shown in FIG. 2. FIG. 3B illustrates a side section view (for example, SECTION C-C) of the memory array 200 relative to a cut plane C-C as shown in FIG. 2. The section views may be examples of cross-sectional views of the memory array 200 with some aspects (for example, dielectric structures) removed for clarity.

Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to tiers 230 (for example, decks, layers, planes, levels, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four tiers 230, a memory array 200 in accordance with examples as disclosed herein may include any quantity of one or more tiers 230 (for example, 64 levels, 128 levels) along the z-direction.

Each word line 205 may be an example of a portion of an access line that is formed by one or more conductive materials (for example, one or more metal portions, one or more metal alloy portions). As illustrated, a word line 205 may be formed in a comb structure, including portions (for example, projections, tines) extending along the y-direction through gaps (for example, alternating gaps) between pillars 220. For example, as illustrated, the memory array 200, may include two word lines 205 per tier 230 (for example, according to odd word lines **205-*a-n*1 and even word lines 205-*a-n*2 for a given level, n), where such word lines 205 of the same tier 230 may be described as being interleaved (for example, with portions of an odd word line 205-*a-n*1 projecting along the y-direction between portions of an even word line 205-*a-n*2, and vice versa). In some examples, an odd word line 205 (for example, of a tier 230) may be associated with a first memory cell 105 on a first side (for example, along the x-direction) of a given pillar 220 and an even word line (for example, of the same tier 230) may be associated with a second memory cell 105 on a second side (for example, along the x-direction, opposite the first memory cell 105) of the given pillar 220. Thus, in some examples, memory cells 105 of a given tier 230 may be addressed (for example, selected, activated) in accordance with an even word line 205 or an odd word line 205**.

Each pillar 220 may be an example of a portion of an access line (for example, a conductive pillar portion) that is formed by one or more conductive materials (for example, one or more metal portions, one or more metal alloy portions). As illustrated, the pillars 220 may be arranged in a two-dimensional array (for example, in an xy-plane) having a first quantity of pillars 220 along a first direction (for example, eight pillars along the x-direction, eight rows of pillars), and having a second quantity of pillars 220 along a second direction (for example, five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (for example, along the z-direction, one or more memory cells 105 for each tier 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (for example, addressed, selected) according to an intersection between a word line 205 (for example, a level selection, which may include an even or odd selection within a tier 230) and a pillar 220. For example, as illustrated, a selected memory cell **105-*a* of the tier 230-*a*-3 may be accessed according to an intersection between the pillar 220-*a*-43 and the word line 205-*a*-32**.

A memory cell 105 may be accessed (for example, written to, read from) by applying an access bias (for example, an access voltage, $V_{access}$, which may be a positive voltage or a negative voltage) across the memory cell 105. In some examples, an access bias may be applied by biasing a selected word line 205 with a first voltage (for example, $V_{access}/2$) and by biasing a selected pillar 220 with a second voltage (for example, $-V_{access}/2$), which may have an opposite sign relative to the first voltage. Regarding the selected memory cell **105-*a*, a corresponding access bias (for example, the first voltage) may be applied to the word line 205-*a*-32, while other unselected word lines 205 may be grounded (for example, biased to 0V). In some examples, a word line bias may be provided by a word line driver (not shown) coupled with one or more of the word lines 205**.

To apply a corresponding access bias (for example, the second voltage) to a pillar 220, the pillars 220 may be configured to be selectively coupled with a sense line 215 (for example, a digit line, a column line, an access line extending along the y-direction) via a respective transistor 225 coupled between (for example, physically, electrically) the pillar 220 and the sense line 215. In some examples, the transistors 225 may be vertical transistors (for example, transistors having a channel along the z-direction, transistors having a semiconductor junction along the z-direction), which may be formed above the substrate of the memory array 200 using various techniques (for example, thin film techniques). In some examples, a selected pillar 220, a selected sense line 215, or a combination thereof may be an example of a selected column line 125 described with reference to FIG. 1 (for example, a bit line).

The transistors 225 (for example, a channel portion of the transistors 225) may be activated by gate lines 210 (for example, activation lines, selection lines, a row line, an access line extending along the x-direction) coupled with respective gates of a set of the transistors 225 (for example, a set along the x-direction). In other words, each of the pillars 220 may have a first end (for example, towards the negative z-direction, a bottom end) configured for coupling with an access line (for example, a sense line 215). In some examples, the gate lines 210, the transistors 225, or both may be considered to be components of a row decoder 110 (for example, as pillar decoder components). In some examples, the selection of (for example, biasing of) pillars 220, or sense lines 215, or various combinations thereof, may be supported by a column decoder 120, or a sense component 130, or both.

To apply the corresponding access bias (for example, $-V_{access}/2$) to the pillar **220-*a*-43, the sense line 215-*a*-4** may be biased with the access bias, and the gate line 210-*a*-3 may be grounded (for example, biased to 0V) or otherwise biased with an activation voltage. In an example where the transistors 225 are n-type transistors, the gate line 210-*a*-3 being biased with a voltage that is relatively higher than the sense line 215-*a*-4 may activate the transistor 225-*a* (for example, cause the transistor 225-*a* to operate in a conducting state), thereby coupling the pillar 220-*a*-43 with the sense line 215-*a*-4 and biasing the pillar 220-*a*-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-*a* is activated, or may be coupled with another voltage source (for example, grounded, via a high-resistance path, via a leakage path) to avoid a voltage drift of the pillars 220. For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (for example, which may be biased with a ground voltage or may be floating). Further, other unselected gate lines 210, including gate line 210-*a*-5 as shown in FIG. 3A, may be biased with a voltage equal to or similar to an access bias (for example, $-V_{access}/2$, or some other negative bias or bias relatively near the access bias voltage), such that transistors 225 along an unselected gate line 210 are not activated. Thus, the transistor 225-*b* coupled with the gate line 210-*a*-5 may be deactivated (for example, operating in a non-conductive state), thereby isolating the voltage of the sense line 215-*a*-4 from the pillar 220-*a*-45, among other pillars 220.

In a write operation, a memory cell 105 may be written to by applying a write bias (for example, where $V_{access}=V_{write}$, which may be a positive voltage or a negative voltage) across the memory cell 105. In some examples, a polarity of a write bias may influence (for example, determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (for example, opposite the first polarity) may set the material of the memory cell with a second threshold voltage, which may be associated with storing a logic 1. A difference between threshold voltages of the material of the memory cell 105 for different logic states stored by the material of the memory cell 105 (for example, a difference between threshold voltages when the material is storing a logic state '0' versus a logic state '1') may correspond to the read window of the memory cell 105.

In a read operation, a memory cell 105 may be read from by applying a read bias (for example, where $V_{access}=V_{read}$, which may be a positive voltage or a negative voltage) across the memory cell 105. In some examples, a logic state of the memory cell 105 may be evaluated based on whether the memory cell 105 thresholds (for example, transitions to a relatively lower-resistance or conductive state, permits current) in the presence of the applied read bias. For example, such a read bias may cause a memory cell 105 storing a first logic state (for example, a logic 0) to threshold (for example, permit a current flow, permit a current above a threshold current), and may not cause a memory cell 105 storing a second logic state (for example, a logic 1) to threshold (for example, may not permit a current flow, may permit a current below a threshold current).

In some examples, due to fabrication deformations or placement underneath a comb feeder (among other reasons), the memory array 200 may include pillars 220 that are unused. For example, the memory array 200 may include one or more unused pillars 220 at the edge (for example, in the x-direction) of the memory array 200, in which an unused pillar 220 may refer to a pillar that is coupled with memory cells that are not used to store data.

Although shown with each pillar 220 coupled with a respective sense line 215 through a respective transistor 225, such a design may be inefficient (for example, space-wise, power consumption-wise) due to the use of respective sense amplifiers for each sense line 215. According to the designs described herein, the sense amplifiers for a set of pillars 220 may be eliminated by coupling the set of pillars 220 to a common digit line through the transistors 225 so that common sensing circuitry can be used to sense the memory cells of the set of pillars 220. The sensing circuitry may include the transistors 225 coupled with unused pillars 220 at the edge (for example, in the x-direction) of the memory array 200, such as pillar 220-*a*-15 and pillar 220-*a*-85. Designs that use common sensing circuitry as described herein may use access techniques, such as the read technique described with reference to FIG. 5, that vary from the access techniques described with reference to other designs. However, the general principles of accessing the memory cells may be the same or similar across various techniques in line with the present disclosure.

Figure 4A:
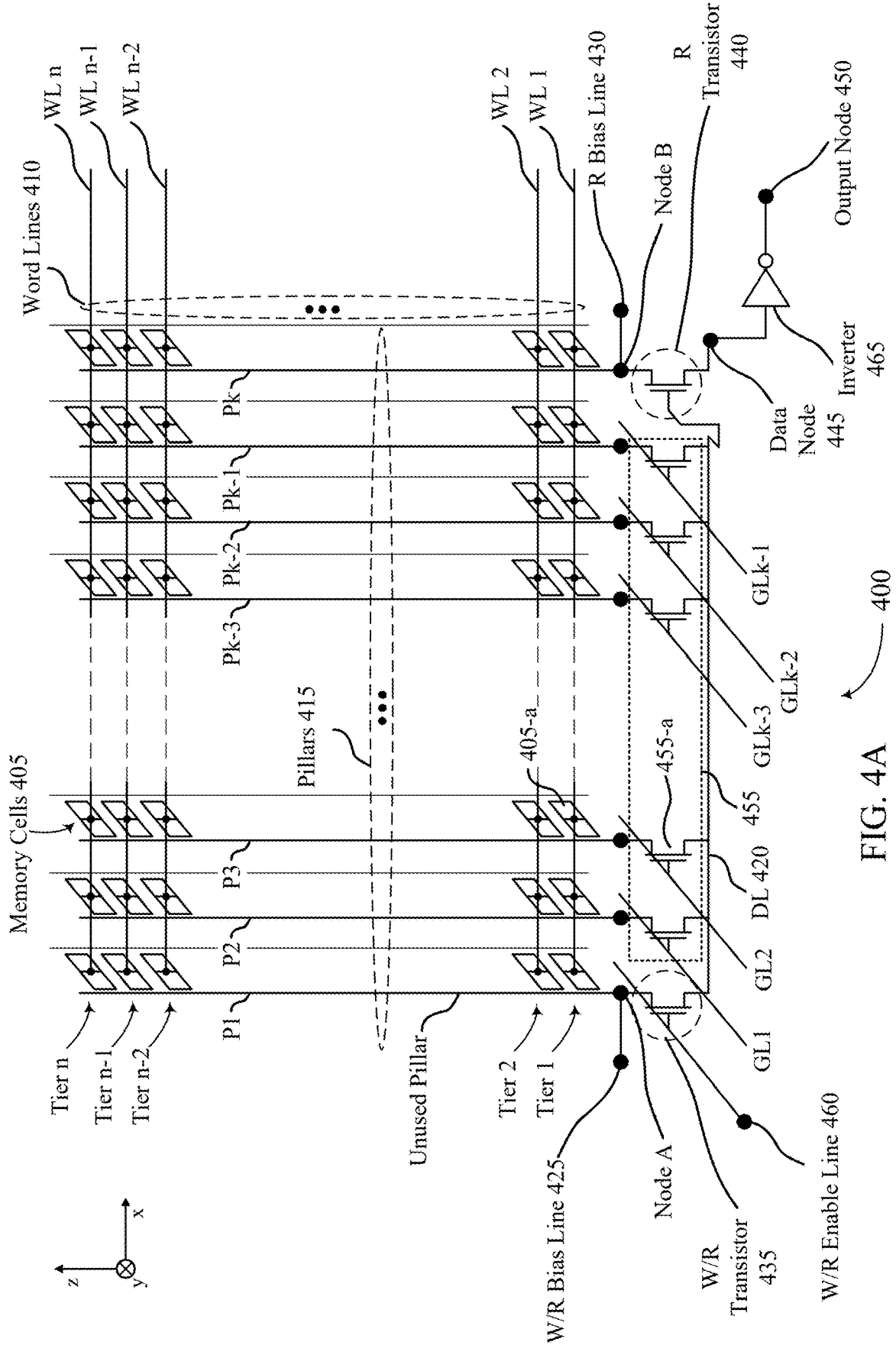

FIG. 4A shows an example of a memory array 400 that supports a sensing circuit in a vertical memory system in accordance with examples as disclosed herein. The memory array 400 may be an example of a memory array in a memory device 100, as described with reference to FIG. 1, or of a memory array 200 as described with reference to FIGS. 2-3B. The memory array 400 may illustrate n tiers, and the memory cells 405 in each tier may be coupled with a common word line 410 but different pillars 415. The pillars 415 may extend through the tiers and may be coupled with a common digit line 420 at the bottom of the pillars 415. The memory array 400 may illustrate the memory cells 405 in a slice, in which a slice of memory cells may refer to memory cells coupled with a common digit line.

As a brief summary, the transistors 455 may be configured as selection components that select a memory cell 405 for access (for example, a read operation). The W/R transistor 435 may be configured to apply a bias voltage to the digit line 420 (for example, during a pre-charge phase of a read operation for a selected memory cell 405). And the R transistor 440 may be configured to apply a bias voltage to the data node 445 (for example, as part of the pre-charge phase), to amplify the voltage of the digit line 420 (which may represent the stored state of the memory cell 405) at the data node 445 (for example, during a sensing phase), or both.

The inverter 465 may invert the voltage of the data node 445 to so that the voltage of the output node 450 is the correct polarity (per the polarity convention followed by the memory device) to represent the stored state. For example, if the voltage of the data node 445 is below a threshold the inverter 465 may output a high voltage (for example, relative to the voltage of the data node 445) and if the voltage of the data node is above the threshold the inverter 465 may output a low voltage (for example, relative to the voltage of the data node 445). If a different polarity convention is followed by the memory device, the inverter 465 may be omitted and the data node 445 and the output node 450 may be the same node or may be electrically separated by a non-inverting component such as a transistor.

The transistors in the memory array 400 may be TFTs that are integrated into the pillars 415. Use of TFTs may allow the W/R transistor 435 and the R transistor 440 to be disposed under a staircase region surrounding the memory array 400 (for example, in scenarios in which the W/R transistor 435 and the R transistor 440 do not fit under the memory array 400). Further, the W/R transistor 435 and the R transistor 440 may each be coupled with an unused pillar 415 and thus may be re-purposed to enable the sensing technique described herein, thereby saving space relative to the designs for other sensing techniques.

The word lines 410 may include n word lines (for example, WL 1 through WL n) and the pillars 415 may include k pillars (for example, pillar P1 through Pillar k), in which n and k are positive integers. As noted, a memory cell 405 may be accessed by biasing the word line 410 and the pillar coupled 415 coupled with that memory cell. For example, to access memory cell 405-a, the memory device may bias word line WL1 and pillar P3. The word lines 410 may be biased by one or more word line drivers (not shown) and the pillars 415 may be biased by one or more bias drivers (for example, a W/R bias driver coupled with W/R bias line 425, a R bias driver coupled with the R bias line 430).

Accessing a memory cell 405 may refer to writing a logic state (for example, state 0, state 1) to the memory cell or reading the logic state from a memory cell 405. A memory cell written with state 0 may have a higher threshold voltage than a memory cell written with state 1. During a read operation for a memory cell, a voltage may be applied across the memory cell (for example, by biasing the corresponding word line 410 and pillar 415). If the applied voltage is higher than the threshold voltage of the memory cell (for example, in the case of a memory cell storing state 1), the memory cell may go into a conductive state and current may flow from the digit line 420 to the word line 410, a phenomenon that may be referred to as the memory cell "snapping" or "thresholding." If the applied voltage is lower than the threshold voltage of the memory cell (for example, in the case of a memory cell storing state 0), the memory cell may remain in a non-conductive state and current (other than perhaps leakage current) may not flow from the digit line 420 to the word line 410.

The transistors 455 may be configured as selection components that select a memory cell 405 for access (for example, a read operation). The transistors 455 may be controlled by bias voltages applied to the gate terminals of the transistors 455. The bias voltages may be applied by gate line drivers (not shown) through the gate lines GL1 through GLk−1, which may be bias lines. The transistors 455 may be electrically between the digit line 420 and the pillars 415 (such that the transistors 455 are part of an activatable conductive path between the digit line 420 and the pillars 415) and may be physically (for example, in the spatial domain, in the x-direction) between the W/R transistor 435 and the R transistor 440.

The W/R transistor 435 may be configured to apply a bias voltage to the digit line 420 (for example, during a pre-charge phase of a read operation for a selected memory cell 405). The W/R transistor 435 may be controlled by a bias voltage applied to the gate terminal of the W/R transistor 435. For example, the W/R transistor 435 may be activated (for example, transition to a conductive state to act as a switch) by applying a bias voltage that overcomes a threshold voltage (for example, the threshold voltage of the W/R transistor 435). The bias voltage may be applied by a W/R driver (not shown) through the W/R bias line 460. So, a first terminal of the W/R transistor 435 may be coupled with the W/R bias line 425 and the pillar P1, a second terminal of the W/R transistor 435 may be coupled with the digit line 420, and the gate terminal of the W/R transistor 435 may be coupled with the W/R bias line 460.

The R transistor 440 may be configured to amplify the voltage of the digit line 420 (which may represent the stored state of a memory cell 405) at the data node 445 (for example, during a sensing phase). The R transistor 440 may be controlled by the voltage on the digit line 420 and the voltage of the R bias line 430. For example, the R transistor 440 may be activated (for example, transition to a conductive state to act as an amplifier) by the voltage of the digit line 420 overcoming a threshold voltage (for example, the threshold voltage of the R transistor 440). In some examples, the R transistor may be configured to apply a bias voltage to the data node 445 so that the data node 445 is initialized to a ground voltage (for example, as part of the pre-charge phase). So, a first terminal (for example, the drain terminal) of the R transistor 440 may be coupled with the R bias line 430 and the pillar Pk, a second terminal (for example, the source terminal) of the R transistor 440 may be coupled with the data node 445 and an input terminal of the inverter 465, and the gate terminal of the R transistor 440 may be coupled with the digit line 420.

The inverter 465 may invert the voltage of the data node 445 so that the voltage of the output node 450 is the correct polarity (per the polarity convention followed by the memory device) to represent the stored state of a memory cell 405. So, an input terminal of the inverter 465 may be coupled with the data node 445 and the R transistor 440, and an output terminal of the inverter 465 may be coupled with the output node 450.

A detailed timing diagram for a read operation is illustrated in and described with reference to FIG. 5. At a high level, the stored state (for example, state 0 or state 1) of the memory cell 405-a, as an example, may be read by biasing (for example, via a corresponding word line driver) the word line WL1 to a low voltage level and biasing (for example, via the W/R driver coupled with the W/R bias line 425) the digit line 420 to a high voltage (for example, so that that there is a voltage drop across the memory cell 405 in examples in which the memory cell 405 is selected). The data node 445 may be initialized to the ground voltage (for example, 0 V) using one of the techniques described herein and with respect to FIG. 5.

After pre-charging the word line WL1 and the digit line 420, the memory cell 405 may be selected by activating the transistor 455-a, which may be accomplished by applying a bias voltage to the gate terminal of the transistor 455 via the gate line GL2. Activating the transistor 455-a may electrically couple the digit line 420 with the pillar P3 (and thus the memory cell 405-a) through the transistor 455-a.

After electrically coupling the digit line 420 with the pillar P3, the voltage of the digit line 420 may represent the stored state of the memory cell 405-a. For example, if the memory cell 405-a stores a first logic state (for example, state 1), the memory cell 405-a may snap and the voltage on the digit line 420 may be reduced from a first level, which may be the pre-charge level, to a second level (for example, because the digit line 420 discharges onto the word line WL1 through the memory cell 405-a, which is in a conductive state). If the memory cell 405-a stores a second logic state (for example, state 0), the memory cell 405-a may not snap and the voltage on the digit line 420 may remain substantially at the first level (for example, minus a small reduction due to current leakage) because the memory cell 405-a remains in a non-conductive state. The leakage current from the digit line 420 may flow at a slower rate than current from a snapped memory cell 405 and thus the respective changes in the voltage of the digit line may be differentiated by the sensing circuitry.

After developing the voltage of the digit line 420 based on the stored logic state of the memory cell 405-a, a bias voltage may be applied (for example, via the R driver coupled with the R bias line 430) to the R transistor 440 so that a voltage of the data node 445 is representative of the voltage of the digit line 420 (and in the case of state 0, so that the R transistor 440 amplifies the voltage of the digit line 420 at the data node 445). For example, if the voltage of the digit line 420 is at the second level (associated with state 1), the R transistor 440 may not be activated and the voltage of the data node 445 may remain at the initialized level (for example, ground). If the voltage of the digit line is at the first level (associated with state 0), the R transistor 440 may be activated and the voltage of the data node 445 may increase from the initialized level to the level of the bias voltage applied to the R transistor 440.

The inverter 465 may invert the voltage of the data node 445 so that the voltage of the output node 450 is the correct polarity (per the polarity convention followed by the memory device) to represent the stored logic state. For example, if the voltage of the data node 445 is below a reference voltage (for example, is at the second level), the inverter 465 may invert the voltage of the data node 445 so that the voltage of the output node 450 is representative of a logic 1. If the voltage of the data node 445 is above a reference voltage (for example, is equal to the bias voltage applied via the R bias line 430), the inverter 465 may invert the voltage of the data node 445 so that the voltage of the output node 450 is representative of a logic 0.

Thus, the W/R transistor 435, the R transistor 440, and the inverter 465 may be used (for example, in lieu of a sense amplifier) to sense the logic state of a memory cell in the memory array 400.

FIG. 4B shows an example of the memory array 400 in a different configuration relative to the memory array illustrated in FIG. 4A. Accordingly, the memory array 400 may include memory cells 405, word lines 410, pillars 415, W/R bias line 425, R bias line 430, W/R transistor 435, R transistor 440, data node 445, output node 450, transistors 455, W/R enable line 460, inverter 465, inverter 470, and gate lines 475. The memory array 400 may illustrate how the W/R bias line 425 and the R bias line 430 can be coupled with the top of respective pillars 415 (as opposed to the bottom of respective pillars 415 as described with reference to FIG. 4A). The memory array 400 may also illustrate the inverter 470 that, together with the inverter 465, provides the functionality of a latch so that a sensed logic state is maintained at the output node 450. The memory array 400 may also illustrate an initialization transistor 480, which may be used to initialize the voltage of the data node 445 for a sensing operation.

The inverter 465 and the inverter 470 may be configured to function as a latch so that a sensed logic state is maintained at the output node 450. For example, the output terminal of the inverter 465 may be coupled with the input terminal of the inverter 470 (and the output node 450), and the output terminal of the inverter 470 may be coupled with the input terminal of the inverter 465 (and the data node 445). By activating the switching component 485 (for example, a switch) in examples in which the voltage of the output node is at a level representative of a sensed logic state (for example, state 0, state 1), the inverter 465 and the inverter 470 may form a feedback loop that maintains the voltage of the output node 450 at that level. Thus, together, the inverter 465 and the inverter 470 may be considered a latch. An activated switching component may a form a conductive path between an input terminal of the switching component and an output terminal of the switching component whereas a deactivated switching component may form an open circuit between the input terminal of the switching component and the output terminal of the switching component.

Before the sensing phase of a read operation, the data node 445 may be initialized to a threshold voltage, such as the ground voltage. Such initialization may be accomplished in a variety of ways. In a first example, the switching component 485 may be activated and a high bias voltage may be applied to the output node 450. In a second example, the R transistor 440 may be activated and the R bias line 430 may apply a bias voltage equal to the ground voltage (for example, 0 V). In a third example, the initialization transistor 480 may be activated so that the data node 445 is coupled with the ground voltage supply 490.

In some examples, multiple digit lines 420 may be coupled with the same data node 445. For example, in addition to being coupled with digit line 420 the data node 445 may also be coupled with digit line 420-a and digit line 420-b, which may be configured similar to the digit line 420 (for example, with respective pillars, memory cells, bias lines, selection transistors, word lines, etc.). Coupling the data node 445 with additional digit lines 420 may increase the capacitance of the data node 445 and network of digit lines 420, which in turn may increase the difference in the rate of current flow between snapped memory cells and digit line leakage (thereby increasing the read window between logic states). Although shown with a 3:1 ratio between the digit lines 420 and the sensing circuitry (for example, the inverter 465), any ratio of digit lines 420 and sensing circuitry can be implemented (for example, 1:1, 2:1, 4:1, etc.).

Thus, the memory array 400 may support different configurations for various benefits and examples.

Figure 5:
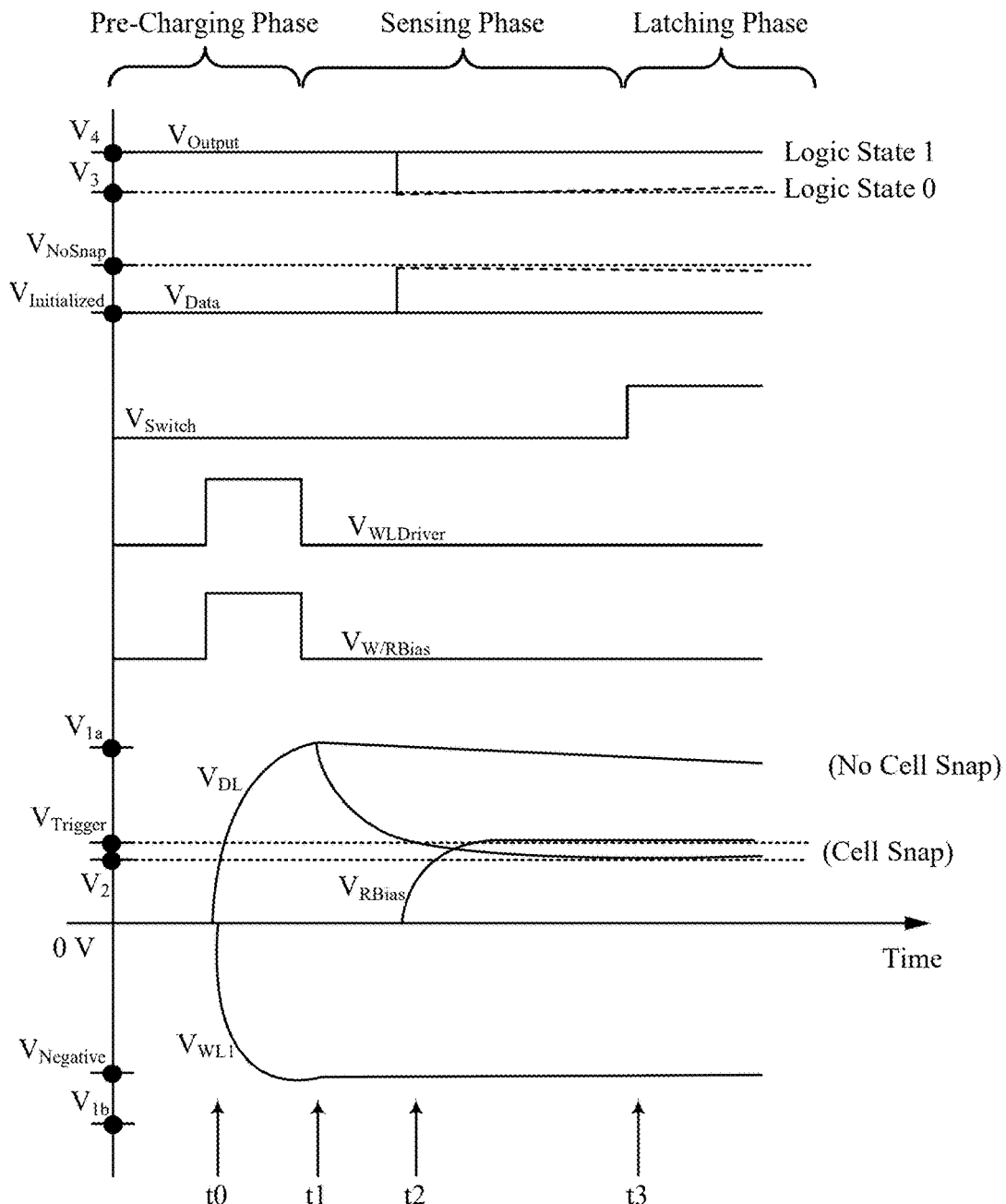
FIG. 5 shows an example of a timing diagram that supports a sensing circuit in a vertical memory system in accordance with examples as disclosed herein.

FIG. 5 shows an example of a timing diagram 500 that supports a sensing circuit in a vertical memory system in accordance with examples as disclosed herein. The timing diagram 500 may represent various amplitudes (for example, magnitudes) of voltages of the memory array 400, as a function of time, at different phases of a read operation to sense a logic state stored by a memory cell such as memory cell 405-a.

The voltage of the output node 450 is denoted $V_{Output}$, the voltage of the data node 445 is denoted $V_{Data}$, the voltage of the switching component 485 is denoted $V_{Switch}$ and may represent a control voltage applied to the switching component 485, the voltage of the word line WL1 is denoted VWL1, and the voltage of the digit line 420 is denoted $V_{DL}$. The voltage of the WL driver coupled with word line WL1 is denoted $WL_{Driver}$, the voltage of the W/R bias line 425 is denoted $V_{W/RBias}$, and the voltage of the R bias line 430 is denoted $V_{RBias}$. The 0V shown on the voltage axis is relative to the word line voltage ($V_{WL1}$), the digit line voltage ($V_{DL}$), and the R bias voltage ($V_{RBias}$).

The read operation may include multiple phases. As a brief summary, before or during the pre-charging phase, the voltage of the data node 445 ($V_{Data}$) may be initialized to a threshold voltage (for example, $V_{Initialized}=0$ V), as described with reference to FIG. 4B. In the pre-charging phase, the word line WL1 may be pre-charged to a negative voltage (denoted $V_{Negative}$) and the digit line 420 may be pre-charged to a positive voltage (for example, a first voltage level denoted $V_{1a}$) so that there is a voltage drop across the memory cell 405-*a*. During the sensing phase the memory cell 405-*a* may be coupled with the digit line 420 (for example, by applying an activation voltage to the transistor 455-*a* via the gate line GL2) so that the voltage on the digit line 420 (for example, during the sensing phase) is based on the logic state stored by the memory cell 405-*a*. Also during the sensing phase, at time t2, the bias voltage applied by the R bias line 430 may be increased to a level $V_{Trigger}$ so that the voltage of the data node 445 ($V_{Data}$) (which is either maintained at the initialized level ($V_{Initialized}$) or increases to $V_{NoSnap}$ depending on the stored logic state) is based on the voltage of the digit line 420 (and thus representative of the stored logic state of the memory cell 405-*a*). During the latching phase, at time t3, the voltage of the switching component 485 ($V_{Switch}$) may be increased so that the voltage of the output node 450 is latched.

A more comprehensive description of the timing diagram is included below.

Sometime before or during the pre-charging phase, the voltage of the data node ($V_{Data}$) may be initialized to a threshold voltage (for example, $V_{Initialized}=0$ V), as described with reference to FIG. 4B.

During the pre-charge phase, the word line WL1 may be pre-charged to a negative voltage and the digit line 420 may be pre-charged to a positive voltage so that there is a voltage drop across the memory cell 405-*a*. For example, at time t0, the word line driver coupled with the word line WL1 may be activated so that a negative bias voltage is applied to the word line WL1. Accordingly, the voltage of the word line WL1 (VWL1) may decrease to a negative level $V_{Negative}$. Also at time t0 (or within a threshold time before or after time t0), the W/R driver coupled with the W/R bias line 425 may be activated so that a positive voltage is applied to the digit line 420 (for example, through the W/R transistor 435). Accordingly, the voltage of the digit line 420 ($V_{DL}$) may increase to a positive level Via. Thus, a voltage drop of a first polarity may be generated between the word line WL1 and the digit line 420.

In an alternative example (for example, for opposite polarity sensing), a voltage drop of a second polarity may be generated between the word line WL1 and the digit line 420. For example, at time t0 (or within a threshold time before or after time t0), the W/R driver coupled with the W/R bias line 425 may be activated so that a negative voltage is applied to the digit line 420 (for example, through the W/R transistor 435). Accordingly, the voltage of the digit line 420 ($V_{DL}$) may decrease to a negative level $V_{1b}$ that is below $V_{Negative}$.

At the end of the pre-charging phase, at time t1, the bias voltages applied to the word line WL1 and the digit line 420 may be removed. For example, the word line driver coupled with the word line WL1 may be deactivated (for example, so that the bias voltage is removed from the word line WL1) and the W/R driver coupled with the W/R bias line 425 may be deactivated (for example, so that the bias voltage is removed from the digit line 420). Additionally or alternatively, the W/R transistor 435 may be deactivated so that the digit line 420 is isolated from the W/R bias line 425. Also at time t1 (or within a threshold time before or after t1), the memory cell 405-*a* may be coupled with the digit line 420 (for example, by activating the transistor 455-*a*).

After removing the bias voltages at time t1, the voltage of the digit line 420 may be representative of the logic state stored by the memory cell 405-*a*. For example, if the memory cell 405-*a* stores logic state 1, the voltage drop across the memory cell 405-*a* may overcome the threshold voltage of the memory cell 405-*a* and the memory cell 405-*a* may snap (for example, transition to a conductive state) so that the digit line 420 discharges onto the word line WL1 through the memory cell 405-*a*. Accordingly, the voltage of the digit line 420 ($V_{DL}$) may decrease from the first voltage level $V_{1a}$ to a second lower voltage level (denoted $V_2$). If the memory cell 405-*a* stores a logic state 0, the voltage drop across the memory cell 405-*a* may not overcome the threshold voltage of the memory cell 405-*a* and the memory cell 405-*a* may not snap (for example, the memory cell 405-*a* may remain in a non-conductive state) so that the digit line 420 does not discharge onto the word line WL1. Accordingly, the voltage of the digit line 420 ($V_{DL}$) may be maintained at substantially the first voltage level $V_{1a}$ (minus a potential negligible drop due to leakage current).

If opposite polarity sensing is used, the voltage of the digit line 420 ($V_{DL}$) may behave differently. For example, in examples in which the memory cell 405-*a* stores logic state 1, the voltage drop across the memory cell 405-*a* may overcome the threshold voltage of the memory cell 405-*a* and the memory cell 405-*a* may snap (for example, transition to a conductive state) so that the word line WL1 discharges onto the digit line 420 through the memory cell 405-*a*. Accordingly, the voltage of the digit line ($V_{DL}$) may increase from the first voltage level $V_{1b}$ to a second higher voltage level. In examples in which the memory cell 405-*a* stores a logic state 0, the voltage drop across the memory cell 405-*a* may not overcome the threshold voltage of the memory cell 405-*a* and the memory cell 405-*a* may not snap (for example, the memory cell 405-*a* may remain in a non-conductive state) so that the word line WL1 does not discharge onto the digit line 420. Accordingly, the voltage of the digit line ($V_{DL}$) may be maintained at substantially the first voltage level $V_{1b}$ (minus a potential negligible drop due to leakage current).

During the sensing phase, the R bias line 430 may be used to apply a bias voltage so that the voltage of the data node 445 ($V_{Data}$) (which is either maintained at the initialized level ($V_{Initialized}$) or increased to $V_{NoSnap}$ depending on the stored logic state) is based on the voltage of the digit line 420 (and thus representative of the stored logic state of the memory cell 405-*a*). For example, at time t2, a bias voltage applied by the R bias line 430 may be increased to $V_{Trigger}$ so that the R transistor 440 is either activated (for example, in the case in which the memory cell 405-*a* stores logic state 0, because the voltage of the digit line $V_{DL}$ is at a level, $V_{1a}$, sufficient to overcome the threshold voltage of the R transistor 440) or deactivated (for example, in the case in which the memory cell 405-*a* stores logic state 1, because the voltage of the digit line ($V_{DL}$), at $V_2$, is insufficient to overcome the threshold voltage of the R transistor 440).

If the R transistor 440 is activated (for example, in the case of logic state 0), the voltage of the data node $V_{Data}$ may increase to $V_{NoSnap}$, which may be based on the voltage of the digit line $V_{DL}$. In examples in which the R transistor 440 is not activated (for example, in the case of logic state 1), the voltage of the data node $V_{Data}$ may be maintained at the initialized level ($V_{Initialized}$).

The voltage of the data node 445 ($V_{Data}$) may be inverted by the inverter 465 to generate the voltage of the output node 450 ($V_{Output}$). Thus, the voltage of the output node 450 ($V_{Output}$) may be high (for example, at $V_4$) in examples in which the voltage of the data node 445 ($V_{Data}$) is low (for example, $V_3$), in which $V_4$ represents stored logic state 1. Alternatively, the voltage of the output node $V_{Output}$ may be low (for example, $V_3$) in examples in which the voltage of the data node 445 ($V_{Data}$) is high (for example, $V_{NoSnap}$), in which $V_3$ represents stored logic state 0.

At time t3, the level of the voltage of the output node 450 ($V_{Output}$) may be latched (for example, maintained) at the output node 450. For example, the voltage of the switching component ($V_{Switch}$) may be increased so that the switching component 485 is activated (thereby forming a closed loop between the inverter 465 and the inverter 470).

Thus, transistor-based sensing circuitry as described herein may be used for a read operation of a memory cell in which a logic state stored by the memory cell is sensed, among other options.

Figure 6:
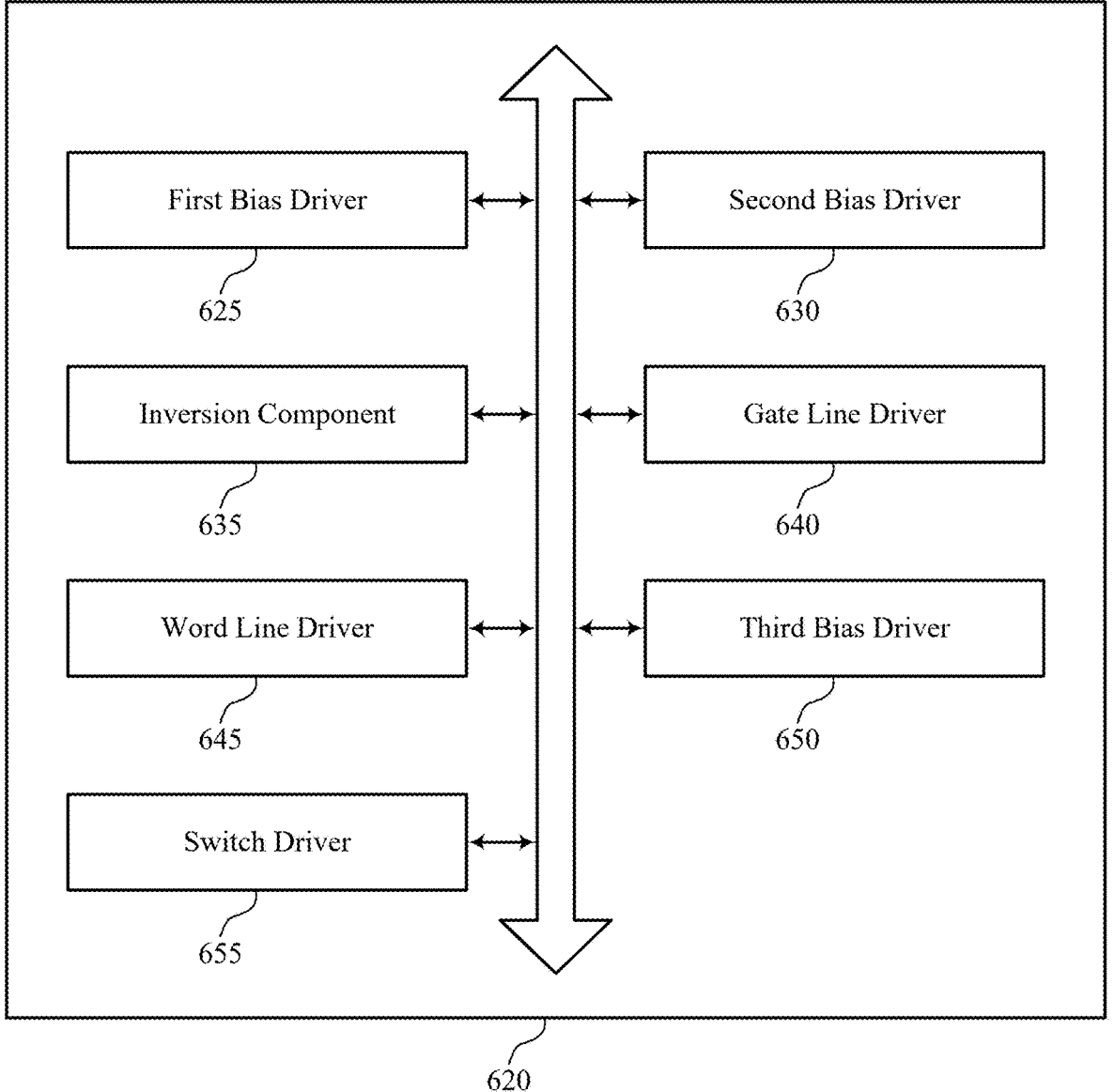
FIG. 6 shows a block diagram of a memory device that supports a sensing circuit in a vertical memory system in accordance with examples as disclosed herein.

FIG. 6 shows a block diagram 600 of a memory device 620 that supports a sensing circuit in a vertical memory system in accordance with examples as disclosed herein. The memory device 620 may be an example of aspects of a memory device as described with reference to FIGS. 1 through 5. The memory device 620, or various components thereof, may be an example of means for performing various aspects of a sensing circuit in a vertical memory system as described herein. For example, the memory device 620 may include a first bias driver 625, a second bias driver 630, an inversion component 635, a gate line driver 640, a word line driver 645, a third bias driver 650, a switch driver 655, or any combination thereof. Each of these components, or components of subcomponents thereof (for example, one or more processors, one or more memories), may communicate, directly or indirectly, with one another (for example, via one or more buses).

The first bias driver 625 may be configured as or otherwise support a means for applying a first bias voltage, using a first transistor, to a digit line that is coupled with a memory cell and coupled with a gate terminal of a second transistor, where a voltage of the digit line increases or decreases to a threshold value based at least in part on applying the first bias voltage. In some examples, the first bias driver 625 may be configured as or otherwise support a means for removing the first bias voltage from the digit line based at least in part on applying the first bias voltage, where the voltage of the digit line after removing voltage of the first bias voltage is based at least in part on a logic state stored by the memory cell. The second bias driver 630 may be configured as or otherwise support a means for applying a second bias voltage to a first terminal of the second transistor based at least in part on removing the first bias voltage from the digit line. The inversion component 635 may be configured as or otherwise support a means for inverting a voltage of a data node coupled with a third terminal of the second transistor to generate, at an output node, an output voltage representative of the logic state stored by the memory cell, the voltage of the data node based at least in part on the voltage of the digit line.

In some examples, the gate line driver 640 may be configured as or otherwise support a means for activating, based at least in part on removing the first bias voltage, a third transistor coupled with the digit line, where activating the third transistor couples the digit line with the memory cell through a pillar.

In some examples, the word line driver 645 may be configured as or otherwise support a means for increasing a voltage of a word line coupled with the memory cell concurrent with applying the first bias voltage to the digit line, where the voltage of the digit line after removing the first bias voltage is based at least in part on the digit line discharging onto the word line through the memory cell.

In some examples, the third bias driver 650 may be configured as or otherwise support a means for activating, before applying the first bias voltage, a third transistor to couple the data node with a ground voltage supply, where the voltage of the data node is initialized to a ground voltage based at least in part on activating the third transistor.

In some examples, the voltage of the data node is inverted by a first inverter including an output terminal coupled with the output node, and the switch driver 655 may be configured as or otherwise support a means for activating, before applying the first bias voltage, a switching component coupled with an input terminal of the first inverter and coupled with an output terminal of a second inverter. In some examples, the voltage of the data node is inverted by a first inverter including an output terminal coupled with the output node, and the third bias driver 650 may be configured as or otherwise support a means for applying a third bias voltage to the output node, where the voltage of the data node is initialized to a ground voltage based at least in part on activating the switching component.

In some examples, the second bias driver 630 may be configured as or otherwise support a means for applying, before applying the first bias voltage, a ground voltage to the first terminal of the second transistor, where the voltage of the data node is initialized to the ground voltage based at least in part on applying the ground voltage.

In some examples, the voltage of the data node is inverted by a first inverter including an output terminal coupled with the output node, and the switch driver 655 may be configured as or otherwise support a means for activating a switching component coupled with an input terminal of the first inverter and coupled with an output terminal of a second inverter, where a level of the output voltage is latched at the output node based at least in part on activating the switching component.

In some examples, the described functionality of the memory device 620, or various components thereof, may be supported by or may refer to at least a portion of at least one processor, where such at least one processor may include one or more processing elements (for example, a controller, a microprocessor, a microcontroller, a digital signal processor, a state machine, discrete gate logic, discrete transistor logic, discrete hardware components, or any combination of one or more of such elements). In some examples, the described functionality of the memory device 620, or various components thereof, may be implemented at least in part by instructions (for example, stored in memory, non-transitory computer-readable medium) executable by such at least one processor.

FIG. 7 shows a flowchart illustrating a method 700 that supports a sensing circuit in a vertical memory system in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include applying a first bias voltage (for example, W/R bias voltage), using a first transistor (for example, W/R transistor 435), to a digit line (for example, digit line 420) that is coupled with a memory cell (for example, memory cell 405-a) and coupled with a gate terminal of a second transistor (for example, R transistor 440), where a voltage of the digit line increases or decreases to a threshold value based at least in part on applying the first bias voltage. In some examples, aspects of the operations of 705 may be performed by a first bias driver 625 as described with reference to FIG. 6.

At 710, the method may include removing (for example, at time t1) the first bias voltage from the digit line based at least in part on applying the first bias voltage, where the voltage of the digit line after removing voltage of the first bias voltage is based at least in part on a logic state stored by the memory cell. In some examples, aspects of the operations of 710 may be performed by a first bias driver 625 as described with reference to FIG. 6.

At 715, the method may include applying a second bias voltage (for example, R bias at t2) to a first terminal of the second transistor based at least in part on removing the first bias voltage from the digit line. In some examples, aspects of the operations of 715 may be performed by a second bias driver 630 as described with reference to FIG. 6.

At 720, the method may include inverting a voltage of a data node (for example, data node 445) coupled with a third terminal of the second transistor to generate, at an output node (for example, output node 550), an output voltage representative of the logic state stored by the memory cell, the voltage of the data node based at least in part on the voltage of the digit line. In some examples, aspects of the operations of 720 may be performed by an inversion component 635 as described with reference to FIG. 6.

In some examples, an apparatus as described herein may perform a method or methods, such as the method 700. The apparatus may include features, circuitry, logic, means, or instructions (for example, a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying a first bias voltage, using a first transistor, to a digit line that is coupled with a memory cell and coupled with a gate terminal of a second transistor, where a voltage of the digit line increases or decreases to a threshold value based at least in part on applying the first bias voltage; removing the first bias voltage from the digit line based at least in part on applying the first bias voltage, where the voltage of the digit line after removing voltage of the first bias voltage is based at least in part on a logic state stored by the memory cell; applying a second bias voltage to a first terminal of the second transistor based at least in part on removing the first bias voltage from the digit line; and inverting a voltage of a data node coupled with a third terminal of the second transistor to generate, at an output node, an output voltage representative of the logic state stored by the memory cell, the voltage of the data node based at least in part on the voltage of the digit line.

Aspect 2: The method, apparatus, or non-transitory computer-readable medium of aspect 1, further including operations, features, circuitry, logic, means, or instructions, or any combination thereof for activating, based at least in part on removing the first bias voltage, a third transistor coupled with the digit line, where activating the third transistor couples the digit line with the memory cell through a pillar.

Aspect 3: The method, apparatus, or non-transitory computer-readable medium of any of aspects 1 through 2, further including operations, features, circuitry, logic, means, or instructions, or any combination thereof for increasing a voltage of a word line coupled with the memory cell concurrent with applying the first bias voltage to the digit line, where the voltage of the digit line after removing the first bias voltage is based at least in part on the digit line discharging onto the word line through the memory cell.

Aspect 4: The method, apparatus, or non-transitory computer-readable medium of any of aspects 1 through 3, further including operations, features, circuitry, logic, means, or instructions, or any combination thereof for activating, before applying the first bias voltage, a third transistor to couple the data node with a ground voltage supply, where the voltage of the data node is initialized to a ground voltage based at least in part on activating the third transistor.

Aspect 5: The method, apparatus, or non-transitory computer-readable medium of any of aspects 1 through 4, where the voltage of the data node is inverted by a first inverter including an output terminal coupled with the output node and the method, apparatuses, and non-transitory computer-readable medium further includes operations, features, circuitry, logic, means, or instructions, or any combination thereof for activating, before applying the first bias voltage, a switching component coupled with an input terminal of the first inverter and coupled with an output terminal of a second inverter and applying a third bias voltage to the output node, where the voltage of the data node is initialized to a ground voltage based at least in part on activating the switching component.

Aspect 6: The method, apparatus, or non-transitory computer-readable medium of any of aspects 1 through 5, further including operations, features, circuitry, logic, means, or instructions, or any combination thereof for applying, before applying the first bias voltage, a ground voltage to the first terminal of the second transistor, where the voltage of the data node is initialized to the ground voltage based at least in part on applying the ground voltage.

Aspect 7: The method, apparatus, or non-transitory computer-readable medium of any of aspects 1 through 6, where the voltage of the data node is inverted by a first inverter including an output terminal coupled with the output node and the method, apparatuses, and non-transitory computer-readable medium further includes operations, features, circuitry, logic, means, or instructions, or any combination thereof for activating a switching component coupled with an input terminal of the first inverter and coupled with an output terminal of a second inverter, where a level of the output voltage is latched at the output node based at least in part on activating the switching component.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 8: An apparatus, including: a set of memory cells in a tier (for example, tier 1), each memory cell in the set of memory cells coupled with a word line common (for example, WL1) to the set of memory cells and coupled with a respective pillar of a set of pillars (for example, pillars 415); a set of transistors each of which is coupled with a digit line (for example, digit line 420) common to the set of memory cells and coupled with a respective pillar of the set of pillars and, the set of transistors including a first transistor (for example, W/R transistor 435), a second transistor (for example, R transistor 440), and a subset of transistors (for example, transistors 455) physically between the first transistor and the second transistor; the first transistor including a first terminal coupled with a first bias line (for example, W/R bias line 425) and a first pillar (for example, pillar P1) of the set of pillars, and including a second terminal coupled with the digit line; and the second transistor including a first terminal coupled with a second bias line (for example, R bias line 430) and a second pillar (for example, pillar Pk) of the set of pillars, and including a gate terminal coupled with the digit line.

Aspect 9: The apparatus of aspect 8, where the second transistor further includes a second terminal coupled with an input terminal of an inverter.

Aspect 10: The apparatus of aspect 9, further including: a second inverter including an input terminal coupled with an output terminal of the inverter, and including an output terminal coupled with the input terminal of the inverter.

Aspect 11: The apparatus of aspect 10, further including: a switching component coupled with the output terminal of the second inverter and the input terminal of the inverter.

Aspect 12: The apparatus of any of aspects 9 through 11, further including: a third transistor including a first terminal coupled with a second terminal of the second transistor, and coupled with an input terminal of the inverter, and including a second terminal coupled with a ground voltage supply.

Aspect 13: The apparatus of any of aspects 8 through 12, where the first terminal of the first transistor is coupled with the first bias line through the first pillar, and the first terminal of the second transistor is coupled with the second bias line through the second pillar.

Aspect 14: The apparatus of any of aspects 8 through 13, where the first pillar is coupled with a first subset of the set of memory cells that are store random logic states, and the second pillar is coupled with a second subset of the set of memory cells that are unused that store random logic state.

Aspect 15: The apparatus of any of aspects 8 through 14, where a gate terminal of the first transistor is coupled with a third bias line, and the second terminal of the first transistor is coupled with the gate terminal of the second transistor through the digit line.

Aspect 16: The apparatus of any of aspects 8 through 15, where the second transistor is configured to amplify a voltage of the digit line at the second terminal of the second transistor.

Aspect 17: The apparatus of any of aspects 8 through 16, further including: a second digit line coupled with a second terminal of the second transistor, the second digit line coupled with second a set of pillars.

An apparatus is described. The following provides an overview of aspects of the apparatus as described herein:

Aspect 18: An apparatus, including: a memory cell (for example, memory cell 405-*a*) coupled with a word line (for example, WL1) and a first pillar (for example, pillar P3); a first transistor (for example, transistor 455-*a*) including a first terminal coupled with the memory cell through the first pillar, and including a second terminal coupled with a digit line (for example, 420), the first transistor physically between a second transistor (for example, W/R transistor 435) and a third transistor (for example, R transistor 440); the second transistor including a first terminal coupled with a first bias line (for example, W/R bias line 425) and coupled with a second pillar (for example, pillar P1), and including a second terminal coupled with the digit line; and the third transistor including a first terminal coupled with a second bias line (for example, R bias line 430) and coupled with a third pillar (for example, pillar Pk), and including a gate terminal coupled with the digit line.

Aspect 19: The apparatus of aspect 18, where the second transistor further includes a second terminal coupled with an input terminal of an inverter.

Aspect 20: The apparatus of aspect 19, further including: a second inverter including an input terminal coupled with an output terminal of the inverter, and including an output terminal coupled with the input terminal of the inverter.

Aspect 21: The apparatus of aspect 20, further including: a switching component coupled with the output terminal of the second inverter and the input terminal of the inverter.

Aspect 22: The apparatus of any of aspects 19 through 21, further including: a third transistor including a first terminal coupled with a second terminal of the second transistor and an input terminal of the inverter, and including a second terminal coupled with a ground voltage supply.

Aspect 23: The apparatus of any of aspects 18 through 22, where a gate terminal of the first transistor is coupled with a third bias line, and the second terminal of the first transistor is coupled with the gate terminal of the second transistor through the digit line.

Aspect 24: The apparatus of any of aspects 18 through 23, further including: a second digit line coupled with a second terminal of the second transistor, the second digit line coupled with a set of pillars.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (for example, "electrically coupling") may refer to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, for example, metals. The source and drain may be conductive and may comprise a heavily-doped, for example, degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processing system (for example, one or more processors, one or more controllers, control circuitry processing circuitry, logic circuitry), firmware, or any combination thereof. If implemented in software executed by a processing system, the functions may be stored on or transmitted over as one or more instructions (for example, code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processors. A processor may also be implemented as at least one of one or more computing devices (for example, a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a set of memory cells in a tier, each memory cell in the set of memory cells coupled with a word line common to the set of memory cells and coupled with a respective pillar of a set of pillars;
a set of transistors each of which is coupled with a digit line common to the set of memory cells and coupled with a respective pillar of the set of pillars and, the set of transistors comprising a first transistor, a second transistor, and a subset of transistors physically between the first transistor and the second transistor;
the first transistor comprising a first terminal coupled with a first bias line and a first pillar of the set of pillars, and comprising a second terminal coupled with the digit line; and
the second transistor comprising a first terminal coupled with a second bias line and a second pillar of the set of pillars, and comprising a gate terminal coupled with the digit line.

2. The apparatus of claim 1, wherein the second transistor further comprises a second terminal coupled with an input terminal of an inverter.

3. The apparatus of claim 2, further comprising:
a second inverter comprising an input terminal coupled with an output terminal of the inverter, and comprising an output terminal coupled with the input terminal of the inverter.

4. The apparatus of claim 3, further comprising:
a switching component coupled with the output terminal of the second inverter and the input terminal of the inverter.

5. The apparatus of claim 2, further comprising:
a third transistor comprising a first terminal coupled with a second terminal of the second transistor, and coupled with an input terminal of the inverter, and comprising a second terminal coupled with a ground voltage supply.

6. The apparatus of claim 1, wherein the first terminal of the first transistor is coupled with the first bias line through the first pillar, and wherein the first terminal of the second transistor is coupled with the second bias line through the second pillar.

7. The apparatus of claim 1, wherein the first pillar is coupled with a first subset of the set of memory cells that are store random logic states, and wherein the second pillar is coupled with a second subset of the set of memory cells that are unused that store random logic state.

8. The apparatus of claim 1, wherein a gate terminal of the first transistor is coupled with a third bias line, and wherein the second terminal of the first transistor is coupled with the gate terminal of the second transistor through the digit line.

9. The apparatus of claim 1, wherein the second transistor is configured to amplify a voltage of the digit line at the second terminal of the second transistor.

10. The apparatus of claim 1, further comprising:
a second digit line coupled with a second terminal of the second transistor, the second digit line coupled with second a set of pillars.

11. A method, comprising:
applying a first bias voltage, using a first transistor, to a digit line that is coupled with a memory cell and coupled with a gate terminal of a second transistor, wherein a voltage of the digit line increases or decreases to a threshold value based at least in part on applying the first bias voltage;
removing the first bias voltage from the digit line based at least in part on applying the first bias voltage, wherein the voltage of the digit line after removing voltage of the first bias voltage is based at least in part on a logic state stored by the memory cell;
applying a second bias voltage to a first terminal of the second transistor based at least in part on removing the first bias voltage from the digit line; and
inverting a voltage of a data node coupled with a third terminal of the second transistor to generate, at an output node, an output voltage representative of the logic state stored by the memory cell, the voltage of the data node based at least in part on the voltage of the digit line.

12. The method of claim 11, further comprising:
activating, based at least in part on removing the first bias voltage, a third transistor coupled with the digit line, wherein activating the third transistor couples the digit line with the memory cell through a pillar.

13. The method of claim 11, further comprising:
increasing a voltage of a word line coupled with the memory cell concurrent with applying the first bias voltage to the digit line, wherein the voltage of the digit line after removing the first bias voltage is based at least in part on the digit line discharging onto the word line through the memory cell.

14. The method of claim 11, further comprising:
activating, before applying the first bias voltage, a third transistor to couple the data node with a ground voltage supply, wherein the voltage of the data node is initialized to a ground voltage based at least in part on activating the third transistor.

15. The method of claim 11, wherein the voltage of the data node is inverted by a first inverter comprising an output terminal coupled with the output node, the method further comprising:
activating, before applying the first bias voltage, a switching component coupled with an input terminal of the first inverter and coupled with an output terminal of a second inverter; and
applying a third bias voltage to the output node, wherein the voltage of the data node is initialized to a ground voltage based at least in part on activating the switching component.

16. The method of claim 11, further comprising:
applying, before applying the first bias voltage, a ground voltage to the first terminal of the second transistor, wherein the voltage of the data node is initialized to the ground voltage based at least in part on applying the ground voltage.

17. The method of claim 11, wherein the voltage of the data node is inverted by a first inverter comprising an output terminal coupled with the output node, the method further comprising:
activating a switching component coupled with an input terminal of the first inverter and coupled with an output terminal of a second inverter, wherein a level of the output voltage is latched at the output node based at least in part on activating the switching component.

18. An apparatus, comprising:
a memory cell coupled with a word line and a first pillar;
a first transistor comprising a first terminal coupled with the memory cell through the first pillar, and comprising a second terminal coupled with a digit line, the first transistor physically between a second transistor and a third transistor;

the second transistor comprising a first terminal coupled with a first bias line and coupled with a second pillar, and comprising a second terminal coupled with the digit line; and
the third transistor comprising a first terminal coupled with a second bias line and coupled with a third pillar, and comprising a gate terminal coupled with the digit line.

19. The apparatus of claim 18, wherein the second transistor further comprises a second terminal coupled with an input terminal of an inverter.

20. The apparatus of claim 19, further comprising:
a second inverter comprising an input terminal coupled with an output terminal of the inverter, and comprising an output terminal coupled with the input terminal of the inverter.

21. The apparatus of claim 20, further comprising:
a switching component coupled with the output terminal of the second inverter and the input terminal of the inverter.

22. The apparatus of claim 19, further comprising:
a third transistor comprising a first terminal coupled with a second terminal of the second transistor and an input terminal of the inverter, and comprising a second terminal coupled with a ground voltage supply.

23. The apparatus of claim 18, wherein a gate terminal of the first transistor is coupled with a third bias line, and wherein the second terminal of the first transistor is coupled with the gate terminal of the second transistor through the digit line.

24. The apparatus of claim 18, further comprising:
a second digit line coupled with a second terminal of the second transistor, the second digit line coupled with a set of pillars.

* * * * *